United States Patent [19]
Wong et al.

[11] Patent Number: 6,107,854
[45] Date of Patent: Aug. 22, 2000

[54] VARIABLE SPEED PATH CIRCUIT AND METHOD

[75] Inventors: Wilson Wong, San Francisco; John E. Turner, Santa Cruz; Thomas H. White, Santa Clara; Rakesh H Patel, Cupertino, all of Calif.

[73] Assignee: Altera Corporation, San Jose, Calif.

[21] Appl. No.: 09/062,379

[22] Filed: Apr. 17, 1998

Related U.S. Application Data

[60] Provisional application No. 60/036,303, Apr. 18, 1997.

[51] Int. Cl.⁷ .................................................. H03H 11/26
[52] U.S. Cl. ......................... 327/281; 327/287; 327/404
[58] Field of Search .................................. 327/276–278, 327/281, 362, 261, 262, 513, 108, 374, 392–394, 396, 401, 403, 404, 407, 408, 409, 285–288

[56] References Cited

U.S. PATENT DOCUMENTS

| | | | |
|---|---|---|---|
| 5,260,611 | 11/1993 | Cliff et al. | 326/39 |
| 5,453,709 | 9/1995 | Tanimoto et al. | 327/276 |
| 5,589,785 | 12/1996 | Garavan | 327/63 |
| 5,668,488 | 9/1997 | Sharpe-Geisler et al. | 327/108 |

*Primary Examiner*—Timothy P. Callahan
*Assistant Examiner*—Minh Nguyen
*Attorney, Agent, or Firm*—Townsend and Townsend and Crew LLP

[57] ABSTRACT

A speed path circuit includes a reference circuit and adjustable drive components that can be turned on or off to vary the speed path in order to meet minimum delay specification for the circuit. In an embodiment, one or more differential amplifiers are used to detect the strength of example circuit elements and generate a reference signal. An optional embodiment includes a mechanism for disconnecting the reference circuit to avoid any DC current drain. The invention may be used in a wide range of integrated circuits and may also be used in a programmable logic device (PLD). Reference circuits may be disconnected from a power source by using programmable logic elements.

18 Claims, 7 Drawing Sheets

VARIABLE SPEED PATH CIRCUIT AND METHOD

CROSS-REFERENCES TO RELATED APPLICATIONS

This application claims priority from provisional patent application Ser. No. 60/036,303, filed Apr. 18, 1997, which is incorporated herein by reference.

BACKGROUND OF THE INVENTION

The present invention relates to electronic circuits. More specifically, the invention relates to drive circuitry that can operate at variable speeds in order not to exceed a minimum specified propagation delay.

The performance of a chip is often described as how fast one signal can cause another signal to change, such as, how fast a change at a given input can be propagated to a given output. The delay in the "path" through the chip between input and output is often specified as a maximum allowed delay value. It is usually desirable to have a path be as fast as possible under worst-case conditions, which are generally higher temperature and lower supply voltage.

In some chip designs, however, it is not desirable for a path to be too fast because this might cause timing problems. One example of such a situation involves the clock to output specification in the Peripheral Component Interconnect (PCI) standards, a family of standards maintained by the PCI Special Interest Group (information available at www.pcisig.com). In one version of a PCI standard, the CLK to signal valid delay is given a range of 2 ns minimum and 11 ns maximum for bused signals and 2 ns to 12 ns for point to point delays. In this case, designing a circuit that is as fast as possible (with a near 2 ns delay, for example) under worst-case conditions, might result in the circuit being too fast (i.e. less than 2 ns) when conditions are more favorable.

What is needed is a variable speed path that can ensure that a propagation speed designed to be as fast as possible under worst-case conditions does not become too fast under other conditions.

SUMMARY OF THE INVENTION

The present invention senses the drive strength of example parts of a drive circuit and generates a reference signal. In an embodiment, the reference signal adjusts the speed performance of a speed path based on the sensed drive strength. In a specific embodiment, a differential sense amplifier senses the strength of an example p-channel device and an example n-channel device and generates a reference voltage that is proportional or inversely proportional to the drive strength of those devices. In a specific embodiment, the reference voltage is used to control a current source, which, when on, acts as an additional pull-up in to a node in part of the speed path. According to an embodiment, the differential sense amp is designed to have a low gain and to switch gradually between a high and low voltage so that the sense amp varies the strength of the current source based on the strength of the n-channel and p-channel devices.

In an alternative embodiment, more than one differential sense amp reference circuit may be used, with each sense amp having different behavior characteristics. For example, a sense amp can be designed to be more sensitive in certain temperature ranges. Thus, more than one sense amp can be used to control the strength of the current source to better tune the speed throughout a wide range of temperatures.

The technique of the present invention can be used both to vary the delay of a speed path or to provide a speed path that has a steady delay through a wide range of operating temperatures and supply voltages.

As is known in the art, many circuit designs and parts of circuit designs can include alternate design elements or can be designed to operate with different polarity by substituting p-channel for n-channel devices and by reversing the polarity of corresponding currents and voltages. Alternative circuits designs are possible where passive resistive elements shown herein are active or active resistive elements are passive. The specific circuits described herein should therefore be seen as examples and the invention is intended to encompass the broadest interpretation of the attached claims and allowable equivalents. In the general description of the operation of the method and apparatus of the invention, and in the claims, proportional should be understood to encompass proportional or inversely proportional, adding current should be understood to encompass adding positive current or adding negative current, and a voltage signal should be understood to encompass an active high voltage signal or an active low voltage signal, all depending on specific circuit implementations.

DESCRIPTION OF SPECIFIC EMBODIMENTS

Reference Circuits Based on Differential Amplifiers

Figure 1A:
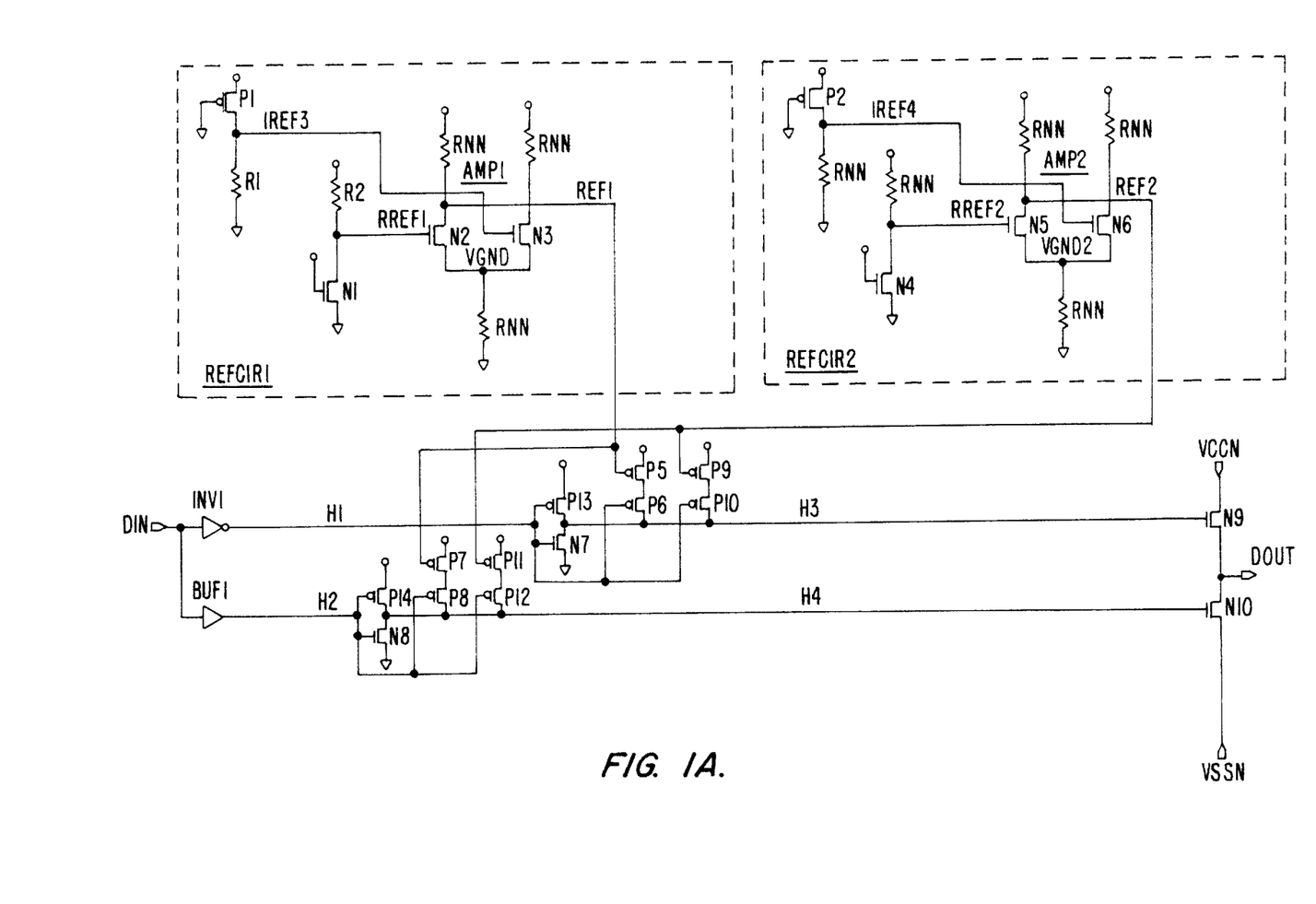
FIG. 1A is a circuit diagram showing an alterable speed path and two reference circuits according to an embodiment of the invention.
Figure 1B:
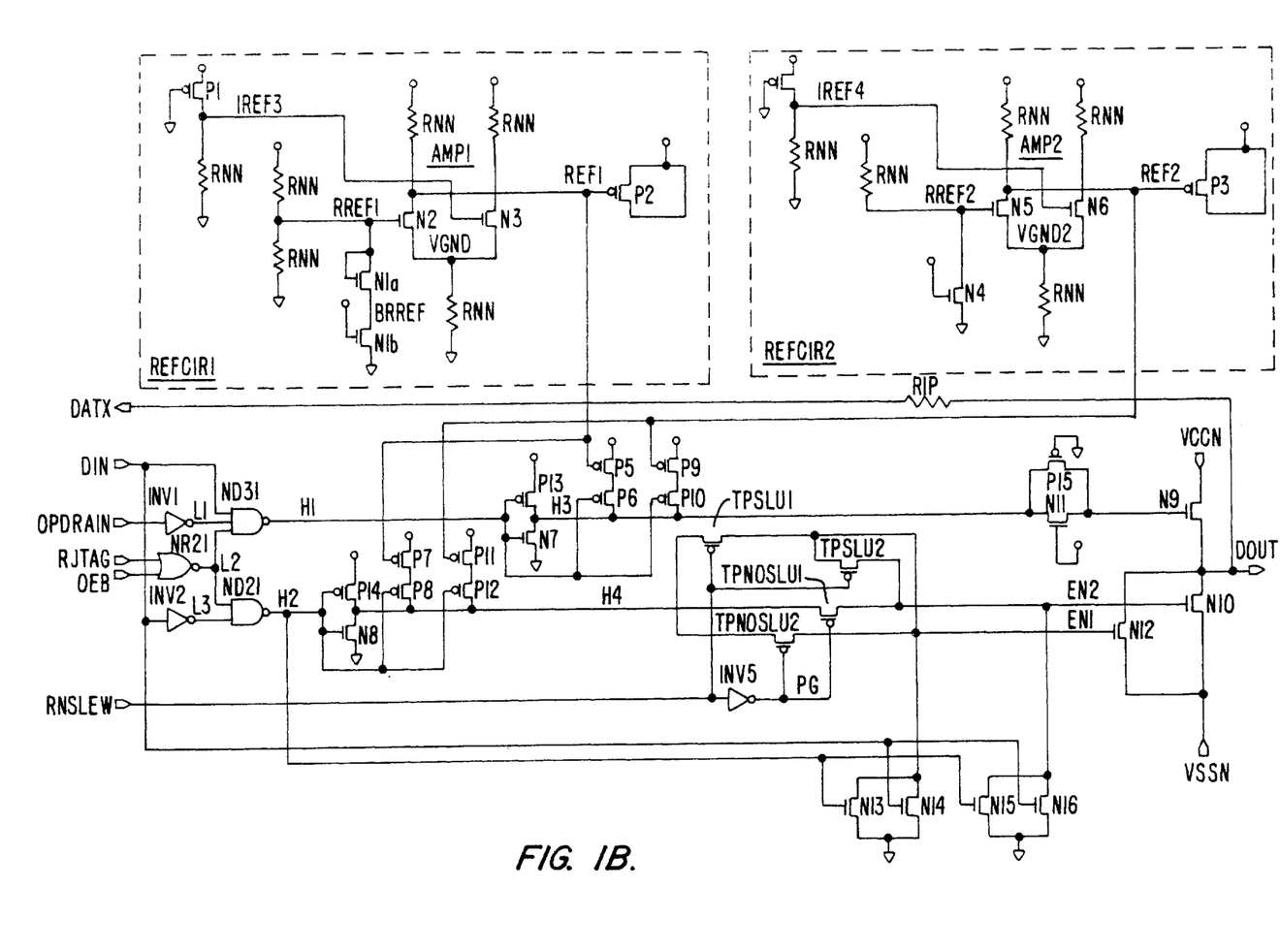
FIG. 1B is a circuit diagram showing an alterable speed path and two reference circuits according to the present invention and additional optional circuit elements.
Figure 1C:
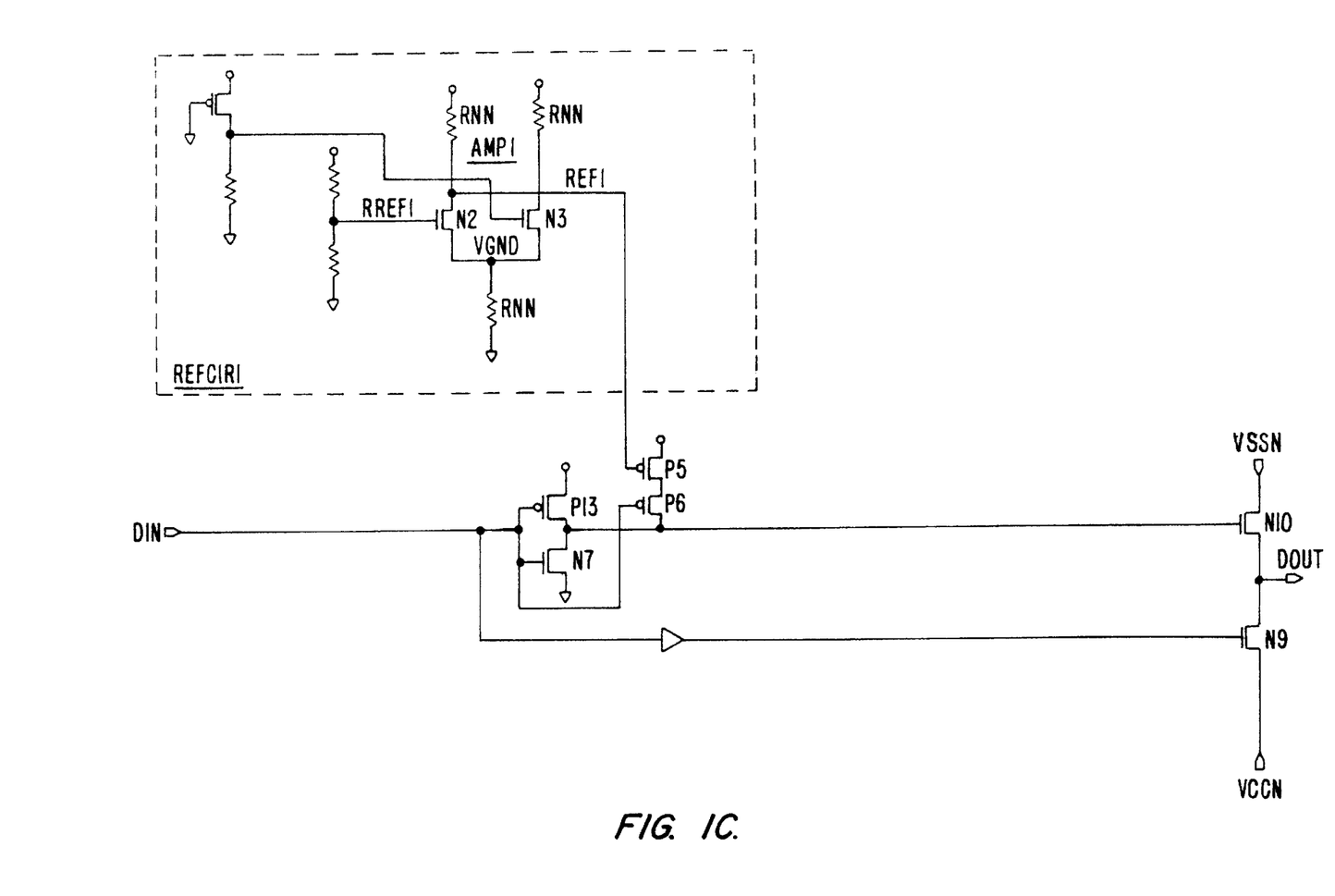
FIG. 1C is a circuit diagram showing a simplified alterable speed path with a simplified reference circuit according to the present invention.

In a specific embodiment, the invention is incorporated into a circuit comprised of FET and other elements suitable for fabrication as part of a semiconductor integrated circuit (IC) as is known in the art. A specific circuit embodiment is shown in FIG. 1A. A variation of this embodiment is shown in FIG. 1B, including many elements that may be desirable in particular circuit embodiments but are not necessary for practicing the invention. FIG. 1C shows a very simple implementation of the invention. Each of these figures show just one specific embodiment of the invention, and the invention should not be limited except as indicated in the attached claims.

In the circuit of FIG. 1A, a reference circuit, REFCIR1 provides a reference voltage REF1 that affects the operation of a driving circuit. In an embodiment, REFCIR1 detects when driving circuits on the IC may drive a signal with such strength that the signal propagates "too fast," i.e. with a delay less than the minimum specified delay for the signal.

REFCIR1, in one embodiment, is constructed of a differential amplifier, AMP1. A gate of transistor N3 (one side of AMP1) is connected to a voltage generated by the drive strength of p-channel transistor P1 and a gate of transistor N2 (the other side of AMP1) is connected to a voltage generated by the drive strength of n-channel transistor N1. A reference voltage signal REF1, is taken from the N2 side of AMP1.

In a specific embodiment of the invention, differential amplifier AMP1 is designed to be a "poor" differential amplifier, with a low gain and analog behavior. AMP1 is also different from a conventional differential amplifier in that both sides of the amplifier are connected to voltages that are presumed to vary with different circuit conditions, rather than having one side connected to a reference voltage that is designed to be constant. In AMP1, the N2 gate is pulled closer to ground as the drive strength of N1 increases and the N3 gate is pulled closer to supply voltage VCC as the drive strength of P1 increases. In either case, REF 1 is pulled closer to ground as the strength of either N1 or P1 increases, and REF1 is closest to ground when N1 and P1 are both at their strongest drive strengths. REFCIR1 thus provides a signal REF1 that is similarly affected and is inversely proportional to the drive strength of a p-channel example transistor and an n-channel example transistor. An alternative embodiment of AMP1 is shown in FIG. 1C wherein on side of AMP1 is connected to a constant reference voltage.

In a specific embodiment, the operation of REFCIR1 in FIG. 1A can be understood as follows. The driving strength of transistor P1 determines a voltage across resistor R1 and this voltage controls the gate of N3. When P1 is strong, the gate voltage on N3 will be pulled towards VCC and this will strongly turn on N3. Because of the operation of the differential amplifier, the more current that flows through N3, the less current will flow through N2 and REF1 will be pulled towards VCC when P1 is strong.

Likewise, the driving strength of transistor N1 determines a voltage across resistor R2 and this voltage controls the gate of N2. When N1 is strong, the gate voltage on N2 will be pulled towards ground, and this will strongly turn off N2 and REF1 will thereby be pulled towards VCC.

In an alternative embodiment, additional reference circuits, such as REFCIR2, can provide additional signals for controlling the drive strength of a drive circuit. These additional reference circuits can be designed to be active when specific conditions are met, such as when particular operating temperatures conditions exist on the circuit. Additional reference circuits may also be used when an IC is designed to be operable at more than one supply voltage, such as ICs or circuits designed to operate at VCC=5 volts or VCC=3 volts and in this case, different reference circuits can be tuned to respond as desired at these different supply voltages.

Figure 3:
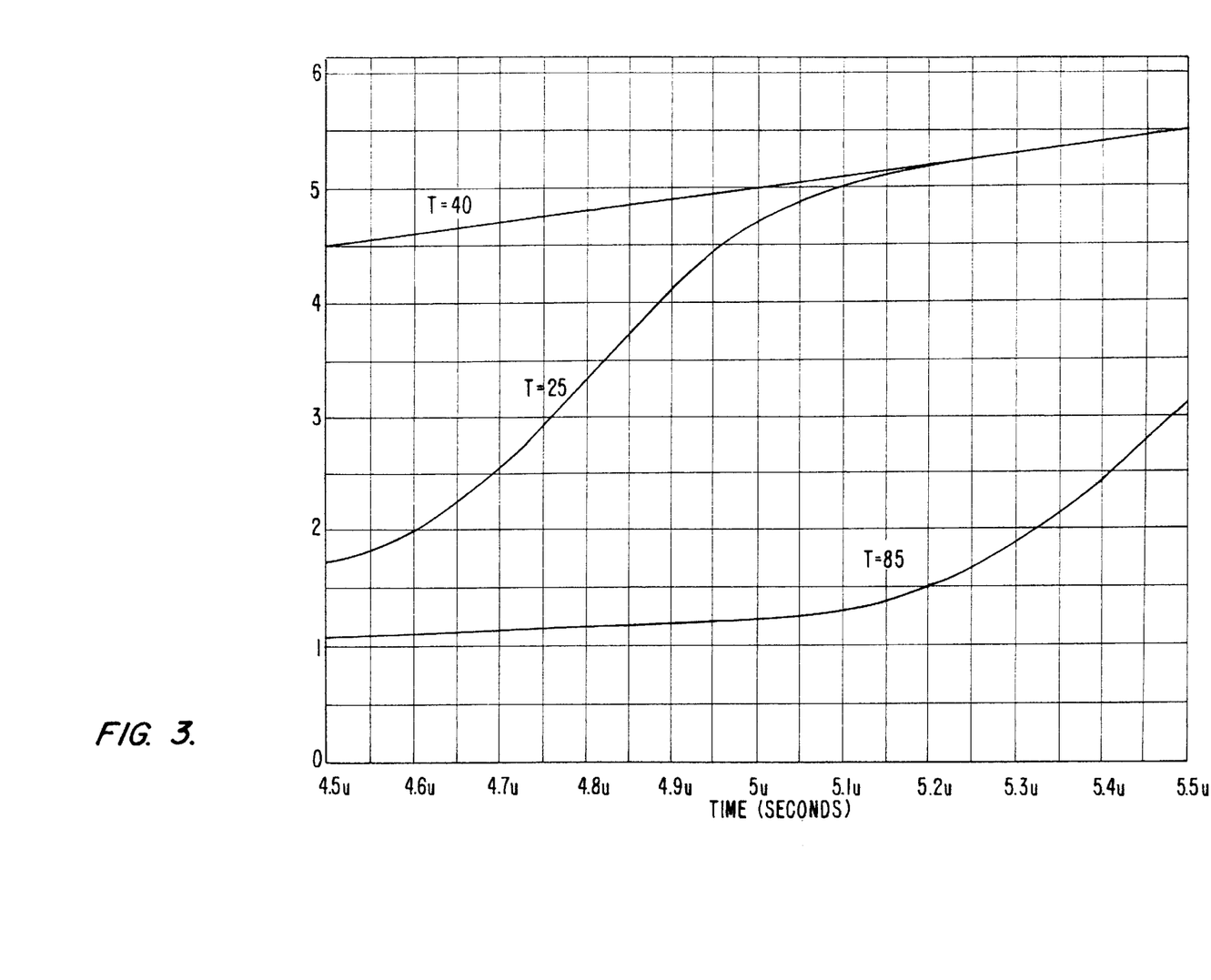
FIG. 3 is a diagram showing supply voltage to output reference voltage at different operating temperatures generated by circuit simulation for one specific reference circuit design.
Figure 4:
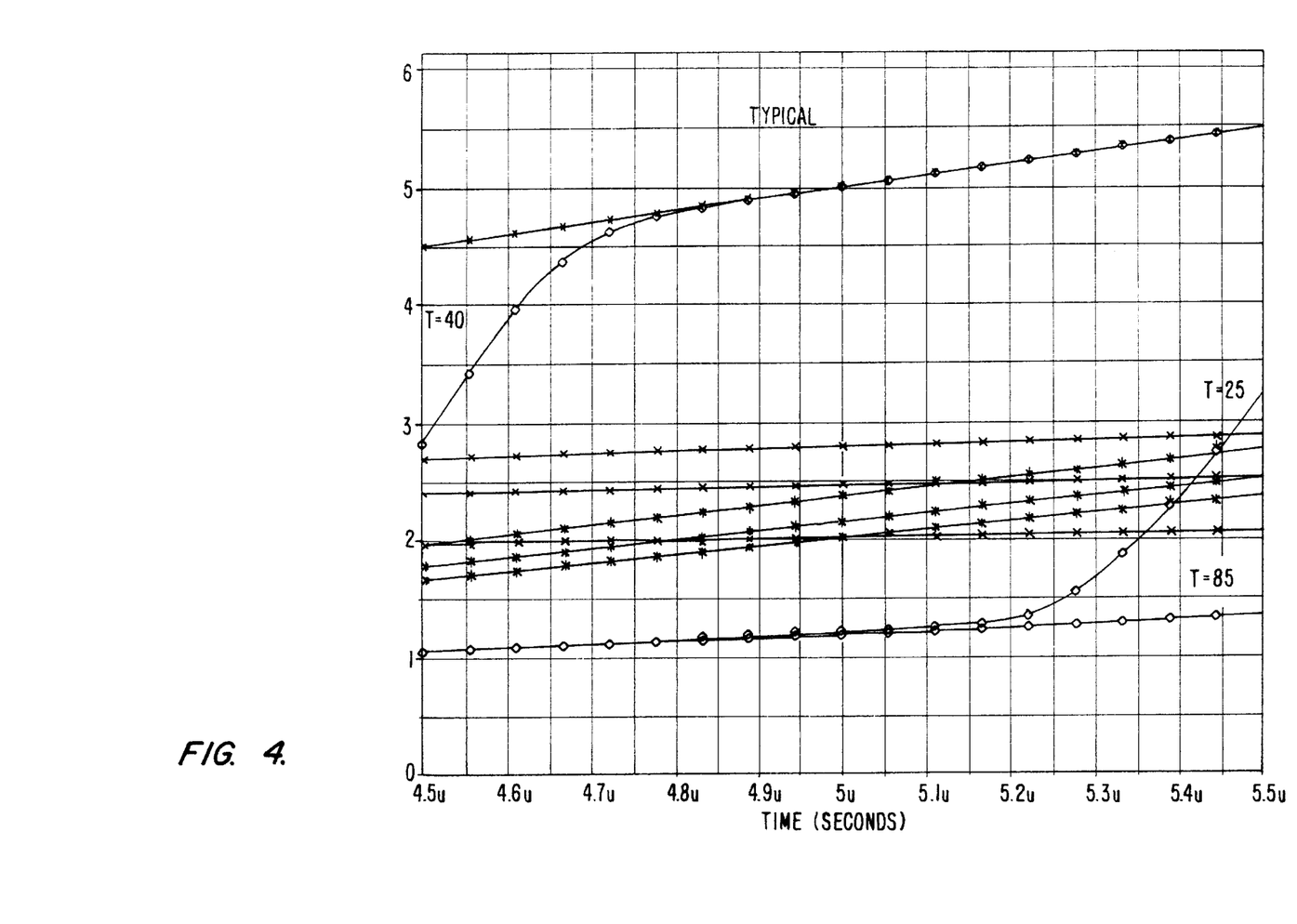
FIG. 4 is a diagram showing supply voltage to output reference voltage at different operating temperatures generated by circuit simulation for a different specific reference circuit design, with a difference temperature behavior.

FIGS. 3 and 4 provide illustration of the operation of two reference circuits, such as REFCIR1 and REFCIR2, which in this case are designed to operating differently at different temperatures. Embodiments are possible wherein the various reference circuits are on together during some operating conditions, are on alternatively during some operating conditions, and are both off during some operating conditions. It will be noted that in the specific embodiment shown REFCIR1 and REFCIR2 are similar in circuit connections and are affect the speed path through similar circuit elements. In a similar fashion, a third, fourth, or any number of reference circuits could be connected to the drive path through additional current sources in order to provide additional control.

Use of Current Source to Change Speed Path

In a different aspect of the invention, a voltage reference signal, such as REF1, REF2 or other reference signals, are used to modify a speed path that connects a data input signal, such as DIN, to a data output signal, such as DOUT. It should be understood that the reference circuits REFCIR1 and REFCIR2 could be used as control elements in different types of drive circuits and, likewise, the drive circuits shown could be used with different reference signal generating circuits.

In the specific embodiment shown in FIG. 1A, DIN is input to INV1 to provide inverted data signal H1 and to BUF1 to provide a non-inverted data signal H2. H1 is the input for a drive inverter made up of transistors P13 and N7. The P13/N7 drive inverter drives pull-up transistor N9, which pulls DOUT towards VCCN when H1 is low, and H3 is high. H2 is the input for the drive inverter made up of transistors P14 and N8, which pulls DOUT towards VSSN when H2 is low and H4 is high.

According to the present invention, the speed of either or both of these two drive paths are modified by a voltage signal, such as REF1, through one or more current sources. In the FIG. 1A embodiment, P5 and P7 are turned on, somewhat gradually, as REF1 is forced low. P5 and P7 therefore become additional pull up elements in their respective speed paths, causing H3 and H4 to be more quickly pulled towards VCC when either of their respective input signals H1 and H2 are low. As REF1 goes high, P5 and P7 are gradually shut off and P13 or P14 must solely drive their respective speed paths towards VCC, causing signal propagation between DIN and DOUT to be slower than when P5 and P7 are on. P6 and P8 are connector transistors gated by data signals H1 and H2 which, when their gate input is low, connect their respective additional pull-up transistors P7 and P5 to the speed path.

In an alternative embodiment, the operation and speed of one or more drive paths can be modified by an additional reference signal REF2 through additional current sources such as P9 and P11. These current sources, when turned on, also provide additional pull up current in their speed path, thereby speeding up the speed path in response to the reference signal that controls them.

Embodiment with Additional Elements

In the specific embodiment shown in FIG. 1B, DIN is first combined with the optional control signals OPDRAIN, RJTAG and OEB, which provide scan test and output enable functions as is known in the art. An optional pair of pass transistors, P15 and N11, are placed in the path to N9 in order to facilitate tuning the circuit. Additional circuitry associated with signal RNSLEW may be incorporated to provide slew control as shown by transistors N12, N13, N14, N15, N16, TPSLU1, TPSLU2, TPNOSLU1, TPNOSLU2, INV5, and associated and signals.

DC Exclusion and Disconnect Circuit

Because differential amplifiers are used in the reference circuits shown in FIGS. 1A, 1B, and 1C, a DC current drain is produced by the reference circuits. Simulations have shown that this current can be tuned to be tenths of milliamps. In an alternative embodiment, additional switching elements are placed between the reference circuit or circuits which allow these circuits to be isolated from the power supply and which drive speed path components to a known state. In cases where power conservation is of higher concern than speed path compliance, the reference circuit can be turned off through an option signal that can be controlled by an programmable option bit or through a metal mask option.

Figure 2:
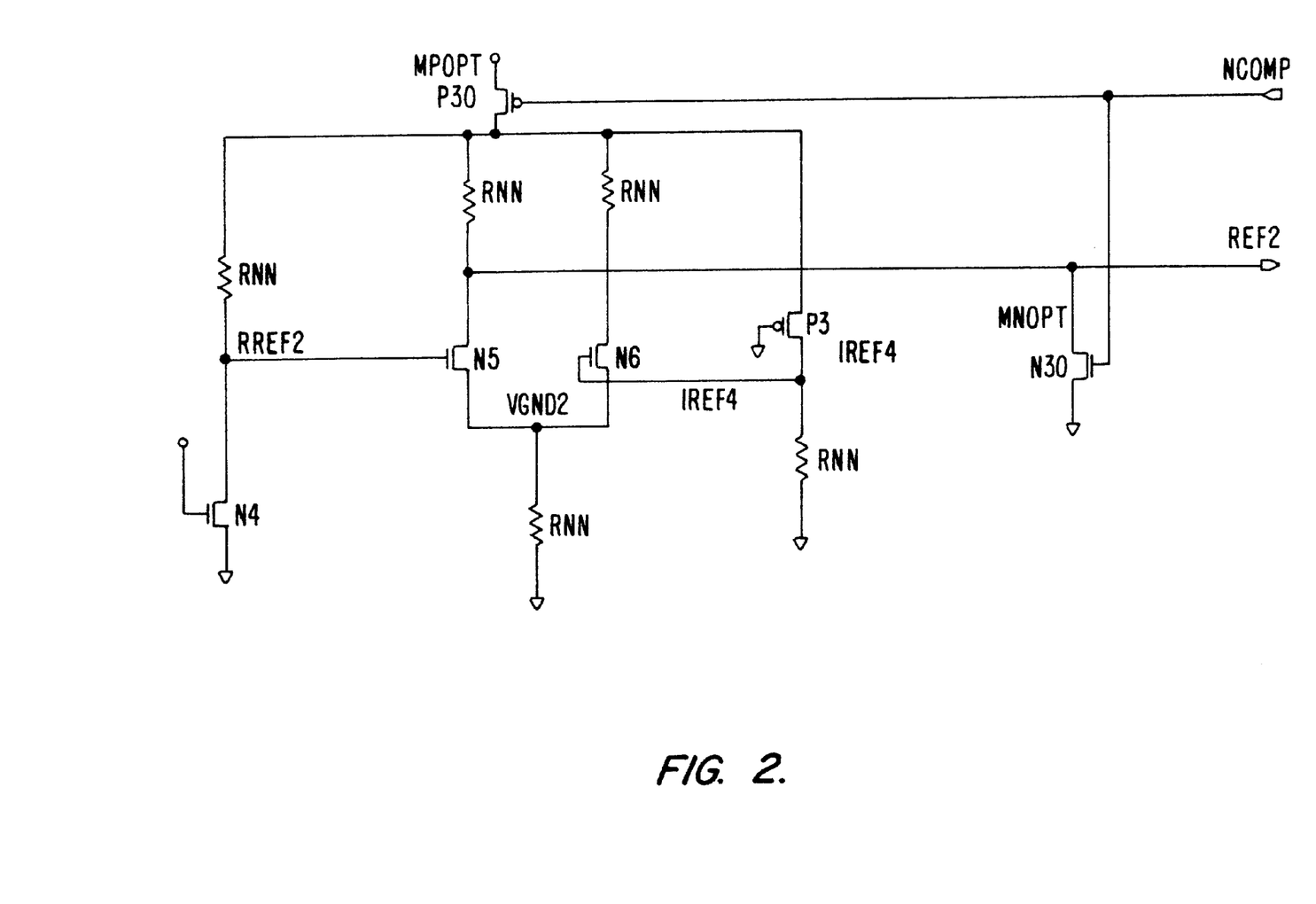
FIG. 2 is a detailed circuit diagram of an alternative embodiment of a reference circuit with an input for turning off the reference circuit to eliminate DC power drain.

FIG. 2 shows an alternative embodiment of a reference circuit wherein a signal NCOMP turns off transistor P30, thus disconnecting the reference circuit from the power supply and turns on transistor N30, thus pulling the reference signal to GND and turning on the additional current source speed path elements. In an alternative embodiment, not shown, disconnecting a reference circuit turns off the controlled additional speed path elements. Such an embodiment could be constructed by modifying the circuit shown in FIG. 2 by placing an inverter between NCOMP and N30 and changing N30 to a p-channel transistor connected to VCC.

Voltage Response Simulations

FIG. 3 is a diagram showing supply voltage to output reference voltage at different operating temperatures generated by circuit simulation for one specific reference circuit design. FIG. 4 is a diagram showing supply voltage to output reference voltage at different operating temperatures generated by circuit simulation for a different specific reference circuit design, with a difference temperature behavior.

In FIG. 3, the y axis indicates the value of a REF1 reference voltage, and the x axis indicates the value of the power supply voltage as the supply voltage is ramp increased from 4.5 volts to 5.5 volts, with a 1 volt increase per microsecond. The three curves indicate REF1 at three operating temperatures, T=−40, T=25, T=85. As is shown, at T=−40, REF1 is essentially equal to VCC and remains effectively high for VCC voltage between 4.5v and 5.5v, and, in the FIG. 1A circuit, the current sources P5 and P7 would therefore remain off. At T=25, REF1 is approximately linearly related to VCC voltage between 4.5v and 5.0v, and, in the FIG. 1A circuit, the current sources P5 and P7 would be on at VCC=4.5v and would gradually turn off as VCC rose to 5.0 volts. At T=85, REF1 remains low essentially throughout the operating range of VCC and in the FIG. 1A circuit, the current sources P5 and P7 would remain on.

FIG. 4 shows the same three curves as FIG. 3 for a different reference circuit, such as REFCIR2, and additional circuit performance characteristics. The three curves that correspond to the FIG. 3 curves are denoted by a diamond and indicate REF2 at three operating temperatures, T=−40, T=25, T=85. As is shown, at T=−40, REF2 is approximately linearly related to VCC voltage between 4.5v and 4.7v, gradually turning off P11 and P9 at a time when P5 and P7 remain off. At T=25, REF2 remains low throughout most of the VCC operating range, at a time when REF1 is linearly related to VCC. At T=85, which would be expected to be worst-case conditions for the speed path, both REF1 and REF2 remain low throughout most ranges of VCC, leaving all current sources turned on to pull up the speed path more quickly.

FIG. 4 additionally shows a top line, indicating the value of VCC. The three middle lines designated with an x indicate values for the voltage at RREF2, which indicates the drive strength of N4, at the three different operating temperatures, with the upper line indicating the worst-case condition of T=85, middle line indicating T=25, and lower line indicating T=−40. The three lower lines, designated with an *, indicate values for the voltage at IREF4, which indicates the drive strength of P2, at the three different operating temperatures, with the lower line indicating the worst-case condition of T=85, middle line indicating T=25, and upper line indicating T=−40. Circle 1 indicates the VCC level at T=−40 at which the gate voltages on either side of differential amp AMP2 cross and then begin to diverge, driving REF2 higher. Circle 2 indicates the VCC level at T=25 at which the gate voltages on either side of differential amp AMP2 cross and then begin to diverge, driving REF2 higher.

Use of Variable Speed Path Circuit in a Programmable Logic Array Device

Figure 5:
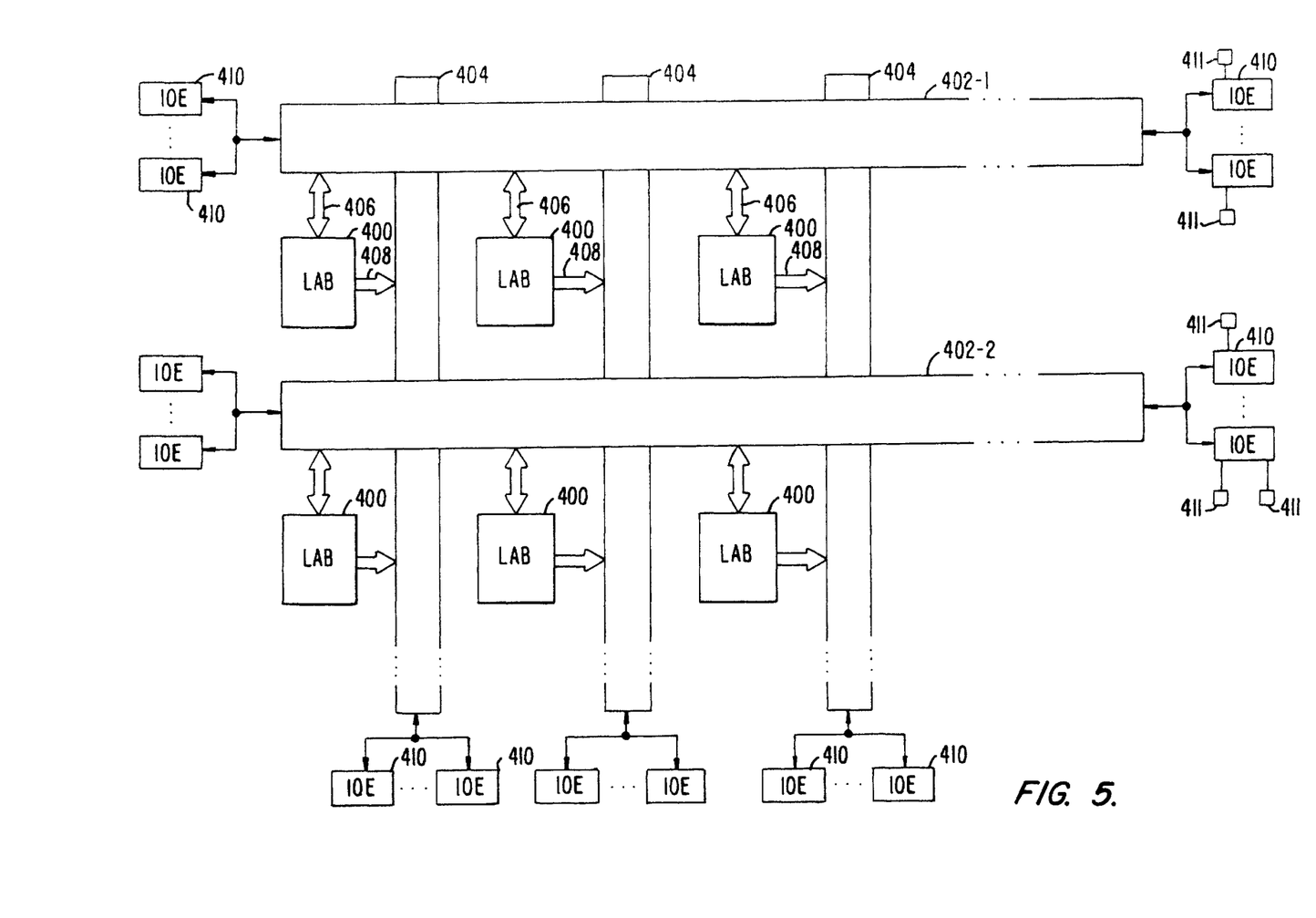
FIG. 5 is a block diagram of a programmable logic device using a variable speed path circuit according to the present invention.

The technique and apparatus of the present invention is particularly suitable for integrated circuits that are adaptable to different uses and that in some uses may need to meet minimum delay specifications, such as programmable logic array devices (PLDs). FIG. 5 is a simplified block diagram of a PLD with an interconnect structure that uses the technique of the present invention. This exemplary PLD includes a plurality of logic array blocks (or LABs) 400 that are interconnected by a matrix of horizontal and vertical interconnect arrays 402 and 404. Each LAB 400 typically includes a number of logic elements that can perform combinatorial as well as registered (sequential) logic. LABs 400 connect to horizontal and vertical interconnect arrays 402 and 404 via buses 406 and 408, respectively. Horizontal and vertical interconnect arrays 402 and 404 connect to bidirectional input/output elements IOEs 410 around the periphery of the circuit that provide interface with the outside world. A more complete description of a specific PLD design may be found in co-assigned U.S. Pat. No. 5,260,611, (the '611 patent) incorporated herein by reference for the purposes of understanding the general nature of a specific PLD.

IOE's 410 are used to interface the complex programmable logic, which as is known in the art includes internal timing and setup constraints, with drive circuits to drive signals to external I/O pins. According to the present invention, circuitry such as that shown in FIGS. 1A, 1B, 1C and/or 2 is included in at least one of IOE's 410 with DIN indicating the data signal exiting the internal PLD logic circuitry, transistors P5 through P13 and N7 and N8 comprising a variable speed pre-driver circuit according to the invention, N9 and N10 indicating the drive transistors for driving an external I/O pin, and DOUT indicating a signal output to an I/O pin. In this embodiment, placing a variable speed circuit just before the external drive transistors N9 and N10 can allow the speed to be set such that N9 and N10 are never driven so fast that undesirable switching noise or ground bounce is generated by the transistors as well as so that minimum delay specifications are met.

Within a PLD, one or more reference circuits associated with a variable path circuit may be made programmably disconnectable by including a fucntional control element, such as 411, with each variable circuit for which programmable disconnect is desired. As discussed in the '611 patent, an FCE can be implemented in a variety of different ways, but is most easily understood as a programmable memory cell. The programmed state of an element 411 can then generate reference signal NCOMP to disconnect one or more reference circuits and to force a controlled speed path component to a known state. In various embodiments, each reference circuit may be controlled separately by an individual FCEs, or a single FCE can disconnect multiple reference circuits from the power supply. When a reference circuit is disconnected from a power supply, the current source controlled by that reference circuit is forced to a particular state, either always on or always off in various embodiments.

Use of the invention within a PLD may also be understood by considering FIG. 9 in the '611 patent. FIG. 9 describes an example tri-state buffer which can be used at varios places in the '611 design, such as for buffers 56 and 60. It will be seen that a variation of the circuit shown in FIG. 1A may be substituted for the circuit in FIG. 9 where variable speed operation is desired. In this case, FIG. 1A operates as a tri-state driver, with signal OBB placing the circuit in the high-impedance tri-state when OEB is high and other signals providing slew and scan test control, similarly to the signal RSELTRI in the '611 patent, and TRIIN and TRIOUT in the '611 patent correspond to DIN and DOUT in FIG. 1A.

While the above is a complete description of embodiments of the present invention, it is possible to use various alternatives, modifications and equivalents. Therefore, the scope of the present invention should be determined not with reference to the above description but should, instead, be determined with reference to the appended clains, along with their full scope of equivalents.

What is claimed is:

1. A variable speed path for transmitting an electronic signal between an input and an output, comprising:
   a first reference circuit configured to sense the drive strength of an example drive component coupled thereto and generate a first reference signal;
   an inverter circuit having a pull-up transistor and a pull-down transistor;
   a first adjustable speed path component configured to add current to said variable speed path in response to said first reference signal, said first adjustable speed path component comprising a current source transistor having its gate operatively coupled to said first reference signal and a control transistor coupled in series with said current source transistor, and wherein said first adjustable speed path component is connected in parallel to said pull-down transistor.

2. The device according to claim 1 wherein said first reference signal changes between an active and an inactive state gradually in proportion to the sensed drive strength of said example drive component such that the amount of current added by said first adjustable speed path component varies with said sensed drive strength.

3. The device according to claim 1 wherein said example drive component comprises a drive transistor of similar construction to said current source transistor and said control transistor that make up said first adjustable speed path.

4. The device according to claim 1 wherein said first reference circuit comprises a differential amplifier.

5. The device according to claim 1 wherein said first reference circuit comprises a differential amplifier with a first control input at a first side of said differential amplifier operatively coupled to an example p-channel drive transistor and a second control input at a second side of said differential amplifier operatively coupled to an example n-channel drive transistor.

6. The device according to claim 1 further comprising:
   a second reference circuit configured to sense the drive strength of a different example drive component coupled thereto and generate a second reference signal; and
   a second adjustable speed path component configured to add current to said variable speed path in response to said second reference signal.

7. The device according to claim 6 wherein said second reference circuit is operative during different temperature ranges than said first reference circuit.

8. The device according to claim 6 wherein said second reference circuit is operative at different supply voltage levels than said first reference circuit.

9. The device according to claim 6 wherein said second reference circuit comprises components of similar construction to components that make up said first reference circuit.

10. The device according to claim 6 wherein said second adjustable speed path component comprises components of similar construction to components that make up said first adjustable speed path component.

11. The device according to claim 1 wherein said variable speed path includes an inverted path and a non-inverted path and wherein said first adjustable speed path component includes an inverted path component and a non-inverted path component.

12. The device according to claim 1 wherein said first reference circuit is disconnectable from a power supply by operation of an enable signal and said first reference signal is caused to reach a known state by operation of said enable signal.

13. The device according to claim 12 wherein the state of said enable signal is determined by a functional control element.

14. The device according to claim 13 further comprising:
   a switch connecting said first reference circuit said power supply; and
   a programmable control element with its output connected to said switch and configured to cause said switch to disconnect said first reference circuit from said power supply.

15. A programmable logic device with a variable minimum delay output comprising:
   at least one configurable logic array block having inputs and outputs and programmable so that at least one output is a configurable logic function of said inputs;
   a programmable interconnect;
   at least one input/output element for connecting at least one signal of said programmable logic device to an external output pin, said input/output element having a programmable minimum delay and comprising:
      first reference circuit configured to sense the drive strength of an example drive component coupled thereto and generate a first reference signal;
      an inverter circuit having a pull-up transistor and a pull-down transistor; and
      a first adjustable speed path component configured to add current to a variable speed path in said input/output element in response to said first reference signal, said first adjustable speed path component comprising a current source transistor having its gate operatively coupled to said first reference signal and a control transistor coupled in series with said current source transistor and wherein said first adjustable speed path component is connected in parallel to said pull-up transistor.

16. A variable speed path for connecting a data input to a data output with a controllable delay comprising:
   a first reference circuit comprising:
      a differential amplifier with a first control input and a second control input;
      a p-channel example drive transistor with an output coupled to said first control input;
      an n-channel example drive transistor with an output coupled to said second control input;
      a first reference voltage output coupled from one side of said first differential amplifier;
   an inverter circuit having a pull-up transistor and a pull-down transistor; and
   an adjustable speed path component comprising:

a current source with its control input operatively coupled to said first reference voltage output and its output coupled to a switch transistor, a control input of said switch transistor operatively coupled to said data input, an output of said switch transistor coupled to said variable speed path, wherein said adjustable speed path component is connected in parallel to said pull-up transistor.

17. A method for adjusting delay in a speed path comprising:

using a first reference circuit configured to sense a drive strength of at least one example transistor and generate a first reference voltage based on said drive strength, said first reference voltage being proportional to said drive strength;

connecting an input of an inverter circuit to an input of said speed path and an output of said inverter circuit to an output of said speed path;

using said first reference voltage to turn on a current source to add current into said speed path such that propagation of a signal between said input of said speed path and said output of said speed path varies with said reference voltage; and using a control-transistor connected between said current source and said output of said inverter circuit to control proper adding of current into said speed path.

18. The method according to claim 17 wherein said first reference voltage changes gradually in response to said drive strength and said current source turns on gradually such that propagation of a signal at given operating conditions between an input of said speed path and an output of said speed path adjustably gradually varied.

* * * * *

UNITED STATES PATENT AND TRADEMARK OFFICE
CERTIFICATE OF CORRECTION

PATENT NO. : 6,107,854
DATED : August 22, 2000
INVENTOR(S) : Wong et al.

It is certified that error appears in the above-identified patent and that said Letters Patent is hereby corrected as shown below:

In the claims, in column 10, at line 16, please insert --is-- after "path".

Signed and Sealed this

Eighth Day of May, 2001

Attest:

NICHOLAS P. GODICI

Attesting Officer        Acting Director of the United States Patent and Trademark Office